(12) United States Patent
Cetingul

(10) Patent No.: US 10,753,998 B2
(45) Date of Patent: Aug. 25, 2020

(54) RESOLUTION ENHANCEMENT OF DIFFUSION IMAGING BIOMARKERS IN MAGNETIC RESONANCE IMAGING

(71) Applicant: Siemens Healthcare GmbH, Erlangen (DE)

(72) Inventor: Hasan Ertan Cetingul, Fulton, MD (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/266,262

(22) Filed: Feb. 4, 2019

(65) Prior Publication Data

US 2019/0178968 A1 Jun. 13, 2019

Related U.S. Application Data

(62) Division of application No. 14/573,316, filed on Dec. 17, 2014, now Pat. No. 10,241,181.

(60) Provisional application No. 61/926,484, filed on Jan. 13, 2014.

(51) Int. Cl.
*G01R 33/563* (2006.01)
(52) U.S. Cl.
CPC ................ *G01R 33/56341* (2013.01)
(58) Field of Classification Search
CPC .................................... G01R 33/56341
USPC .................. 324/300–322; 600/407–435; 382/128–131
See application file for complete search history.

(56) References Cited

U.S. PATENT DOCUMENTS

| | | | |
|---|---|---|---|
| 5,969,524 A * | 10/1999 | Pierpaoli ......... | G01R 33/56341 324/307 |
| 6,642,716 B1 * | 11/2003 | Hoogenraad .... | G01R 33/56341 324/309 |
| 6,992,484 B2 * | 1/2006 | Frank ............... | G01R 33/56341 324/307 |
| 7,672,790 B2 | 3/2010 | McGraw et al. | |
| 7,881,878 B2 | 2/2011 | Burrus et al. | |
| 7,948,503 B2 | 5/2011 | Shekhar et al. | |
| 8,274,859 B2 | 9/2012 | Maucec et al. | |
| 8,526,698 B2 | 9/2013 | Degani et al. | |
| 2005/0240097 A1 * | 10/2005 | Lange ............... | G01R 33/56341 600/410 |
| 2008/0109171 A1 * | 5/2008 | McGraw ........... | G01R 33/56341 702/19 |

(Continued)

OTHER PUBLICATIONS

Fletcher et al., Riemannian geometry for the statistical analysis of diffusion tensor data, 87 Signal Processing 250-262 (2007) (Year: 2007).*

(Continued)

*Primary Examiner* — Tung X Nguyen
*Assistant Examiner* — Robert P Alejnikov, Jr.

(57) ABSTRACT

Resolution is enhanced for diffusion MR imaging. The tensors modeling the underlying water diffusion in brain tissues are used to interpolate other diffusion tensors, providing higher resolution diffusion biomarker images. Each diffusion tensor is represented by a pair of elements, the one in an 'orientation space' and another in a 'shape space.' The tensors are iteratively interpolated by averaging the aforementioned elements in separate mathematical spaces. The weighted average of the shape components of the diffusion tensors is computed in closed form, which decreases the runtime.

4 Claims, 2 Drawing Sheets

(56) References Cited

U.S. PATENT DOCUMENTS

| | | | |
|---|---|---|---|
| 2008/0170802 A1* | 7/2008 | Arsigny | G06T 5/002 382/276 |
| 2011/0199084 A1* | 8/2011 | Hasan | A61B 5/055 324/309 |
| 2011/0282183 A1* | 11/2011 | Song | G01R 33/56341 600/410 |
| 2012/0280686 A1 | 11/2012 | White et al. | |
| 2013/0009959 A1* | 1/2013 | Calamante | G01R 33/56341 345/428 |
| 2013/0243299 A1 | 9/2013 | Goto et al. | |
| 2013/0257910 A1 | 10/2013 | Park et al. | |
| 2017/0052241 A1* | 2/2017 | Cetingul | A61B 5/0042 |

OTHER PUBLICATIONS

Yang et al., Feature-based interpolation of diffusion tensor fields and application to human cardiac DT-MRI, 16 Med. Image Analysis 459-481 (2012) (Year: 2012).*

Lazar et al., An error analysis of white matter tractography methods: synthetic diffusion tensor field simulations, 20 NeuroImage 1140-1153 (2003) (Year: 2003).*

Alexander, D.C., et al., Spatial Transformations of DT MRI, 20 IEEE Trans. Med. Img. 1131 (Nov. 2001) (Year: 2001).*

Corouge, I., et al., Fiber tract-oriented statistics for quantitative DT MRI analysis, 10 Med. Img. Analysis 786 (Aug. 2006) (Year: 2006).*

Zhang, H., et al., Deformable registration of FT MRI with explicit orientation optimization, 10 Med. Img. Analysis 764 (Aug. 2006) (Year: 2006).*

Zhukov, L., et al., Oriented Tensor Reconstruction: Tracing Neural Pathways from DT MRI, 2002 IEEE Visualization (Oct. 2002) (Year: 2002).*

Ncube, S., et al., "A novel Riemannian metric for analyzing HARDI data" in Proceedings of the SPIE, vol. 7962, 2011.

Cetingul, H.E., et al., "Group action induced averaging for HARDI processing" ISBI, pp. 1389-1392, 2012.

Yap, P., et al., "Resolution enhancement of diffusion-weighted images by local fiber profiling" MICCAI, vol. LNCS 7512, pp. 18-25, p. 2012.

Goh, A., et al., "A nonparametric Riemannian framework for processing high angular resolution diffusion images and its applications to ODF-based morphometry" NeuroImage, vol. 56, No. 1, pp. 1181-1201, 2011.

Scherrer, B., et al., "Super-resolution reconstruction to increase the spatial resolution of diffusion weighted images from orthogonal anisotropic acquisitions" Medical Image Analysis, vol. 16, No. 7, pp. 1465-1476, 2012.

Arsigny, V., et al.,"Log-Euclidean metrics for fast and simple calculus on diffusion tensors" Magnetic Resonance in Medicine, vol. 56, No. 2, pp. 411-421, 2006.

Calamante, F., et al., "Track-density imaging (TDI): super-resolution white matter imaging using whole-brain track-density mapping" NeuroImage, vol. 53, No. 4, pp. 1233-1243, 2010.

* cited by examiner

RESOLUTION ENHANCEMENT OF DIFFUSION IMAGING BIOMARKERS IN MAGNETIC RESONANCE IMAGING

RELATED APPLICATIONS

The present patent document is a divisional of U.S. patent application Ser. No. 14/573,316 filed Dec. 17, 2014 which claims the benefit of the filing date under 35 U.S.C. § 119(e) of Provisional U.S. Patent Application Ser. No. 61/926,484, filed Jan. 13, 2014, which is hereby incorporated by reference.

BACKGROUND

The present embodiments relate to magnetic resonance imaging (MRI). In particular, clinically relevant biomarker images derived from diffusion MRI are provided at a greater resolution. Diffusion MRI may describe the white matter architecture in vivo by quantifying variations in water diffusion in the brain.

Diffusion weighted MR images (DWIs) acquired using conventional MR scanning protocols are often limited by insufficient spatial resolution. Several diffusion biomarkers/maps (e.g., fractional anisotropy) can be derived from the DWIs using, for instance, the diffusion tensor (DT) model. The biomarker images are desired to be in a higher resolution than the scan resolution for better visualization of the structural brain connectivity and its impairment, if present, due to neurological diseases. However, conventional interpolation/upsampling of the biomarker images does not yield anatomically accurate and reliable results.

Diffusion MR image resolution has been enhanced using processes applied before or after fitting a diffusion model to the DWIs. In some approaches, multiple DWI scans acquired along a number of orthogonal through-plane axes stitched with non-linear registration are used. These approaches seek to increase the resolution of the raw data, not directly increasing the resolution of the biomarker images clinicians prefer to visually investigate. In another approach, extracted white matter fiber pathways are used to compute higher-resolution diffusion maps from the 'track density' information. However, this approach may be heuristic (i.e., non-reproducible) and by definition, prone to the errors in tractography.

BRIEF SUMMARY

By way of introduction, the preferred embodiments described below include methods, systems, instructions, and computer readable media for resolution enhancement for diffusion MR imaging. The tensors modeling the underlying water diffusion in brain tissues are used to interpolate other tensors, providing higher resolution diffusion biomarker images. Each diffusion tensor is represented by a pair of elements, the one in an 'orientation space' and another in a 'shape space.' The tensors are iteratively interpolated by averaging the aforementioned elements in separate mathematical spaces. The weighted average of the shape components of the diffusion tensors is computed in closed form, which decreases the runtime.

In a first aspect, a method is provided for resolution enhancement of diffusion MR based biomarker images. The diffusion tensors are generated from the measurements of a diffusion magnetic resonance imaging system. The resulting first image (or field) of tensors is at the first (i.e., scan) resolution. A diffusion tensor processor constructs new tensors (i.e., interpolants) within a range of a discrete set of the first image of tensors. The new or second image of tensors has a resolution that is higher than the first image. The interpolation is performed via Riemannian weighted averaging by using a rotation group in three dimensions as an orientation space and a shape space whose elements are the diffusion tensors with the same orientation. The interpolation includes computing the shapes of the interpolants in closed form. The magnetic resonance imaging system calculates diffusion biomarkers of the patient from the resulting higher resolution second image of diffusion tensors. An image of the biomarkers is displayed.

In a second aspect, a non-transitory computer readable storage medium has stored therein data representing instructions executable by a programmed processor for resolution enhancement for diffusion MR imaging. The storage medium includes instructions for: solving for tensors representing water diffusion in the brain at locations outside of an original lattice of tensors obtained by a magnetic resonance imager; computing a biomarker image from the resulting larger lattice of tensors, the biomarker image having values for the locations not obtained by the magnetic resonance imager; and displaying the biomarker image on a display.

In a third aspect, a magnetic resonance system is provided. A main magnet is configured to generate a magnetic field. A plurality of gradient coils is configured to orient molecules at a plurality of different directions. A radio frequency coil is configured to reorient the molecules and detect a return of the molecules to the gradient orientation. A processor is configured to form a higher-resolution diffusion biomarker image from the detected returns by fitting tensors to measured MR signals, interpolating these tensors to form a higher-resolution image of tensors with closed form shape analysis, and computing a diffusion biomarker image from the higher-resolution image of tensors.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Diffusion biomarker images are enhanced in spatial resolution. Low-resolution (i.e. original) images of the diffusion model (e.g., diffusion tensor images) are used to obtain higher-resolution diffusion maps/biomarkers. Riemannian analysis of diffusion tensors (DTs) is used with the information from the diffusion model separated into orientation and shape components. To obtain a high-resolution diffusion biomarker image from the DT image, the interpolation is performed via Riemannian weighted averaging of the orientation and shape components of the tensors in a disjoint manner.

To do calculus with diffusion tensors, the Log-Euclidean metric, $d_{LE}$, which is a similarity-invariant metric with computational advantages, is used. The rotation group is taken as the orientation space and the space of diffusion tensors with the same orientation is taken as the shape space. The geodesic distances in these spaces and the rotation group action on the space of diffusion tensors defines a distance between diffusion tensors. Riemannian weighted averaging of tensors is performed using this distance. The solution is computed via an iterative method that alternates between aligning the diffusion tensors to the current estimate and updating its orientation (with respect to shape) component given the current alignments and the shape (with respect to orientation) component. Higher-resolution diffusion maps may be provided.

The computation may be more efficient by finding the shape of the interpolants (i.e., newly constructed tensors) in closed form while iteratively looking for the final solution. The interpolation may be performed more rapidly by a computer due to the closed form solution. The Log-Euclidean metric, which does not consider the separation of tensor information into orientation and shape components, causes artificial tensor bloating.

Figure 1:
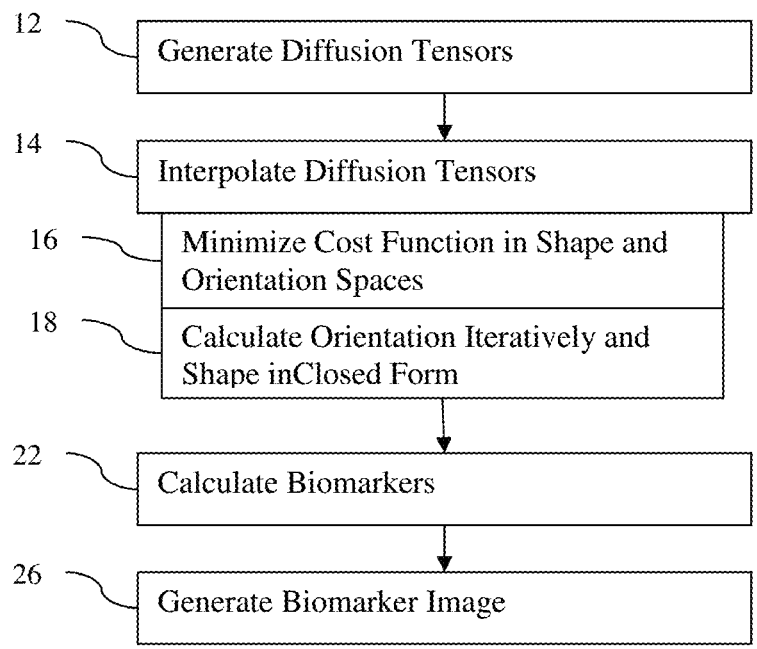
FIG. 1 is a flowchart of one embodiment of a method for resolution enhancement for diffusion MR imaging.

FIG. 1 shows a flowchart of a method for resolution enhancement for diffusion MR imaging. MR data is acquired to measure the MR signal attenuation at different gradient directions. Diffusion tensors at the scan resolution are fitted to these resulting sets of data for the volume. To increase the resolution, new diffusion tensors are interpolated from the known tensors generated from the measured data.

Figure 4:
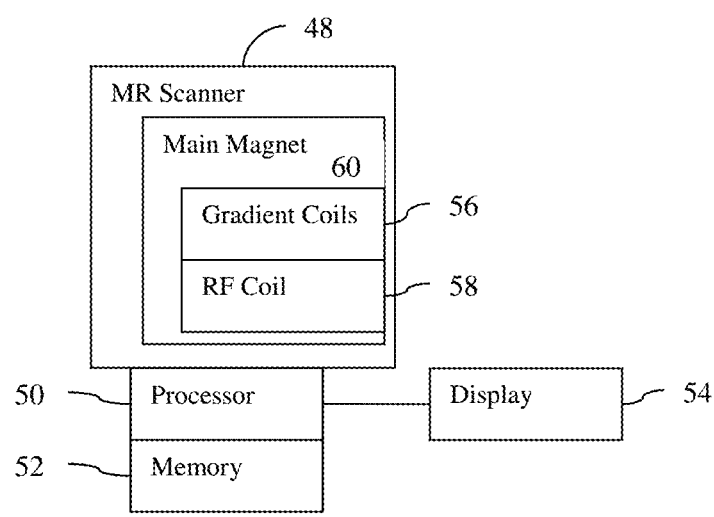
FIG. 4 is one embodiment of a magnetic resonance system.

The method is implemented by the system of FIG. 4 or another system. For example, the method is implemented on a computer or processor associated with a MRI system or PACS. The magnetic resonance system, using a main magnet generating a $B_0$ field, gradient coils aligning the field along different directions at different times, and one or more radio frequency coils connected with transmitters and receivers to displace the alignment, measures raw MR data at different gradient directions. A processor of the magnetic resonance system generates the diffusion tensors from the measured MR signals and performs the interpolation of the tensors, calculation of biomarkers from the previously generated and newly constructed tensors, and creates an image. Other distributions of functions among components may be used.

The acts are performed in the order shown or other orders. For example, act 16 is iterative and includes performing act 18 in the iterations, so act 18 is a pre-condition or post adjustment in the minimization of act 16. The acts are performed with the patient in the MRI system, such as laying in a generally uniform main magnetic field. Alternatively, some or all of the acts are performed after the patient is not laying in the main magnetic field.

Additional, different, or fewer acts may be provided. For example, the generation of an image in act 26 is not provided, but instead the biomarker images are stored or transmitted. As another example, acts 16 and/or 18 are not performed. In yet another example, act 22 is not performed and the diffusion tensors are used for diffusion MR image analysis. Other acts include MRI acts. Filtering or other image processing may be used.

In act 12, the diffusion tensors are generated from the measurements of a diffusion magnetic resonance imaging system scanning a patient. The patient is positioned in a main magnetic field. Gradient coils are used to reorient water molecules in particular directions. For each orientation, the MRI system applies a radio frequency pulse or pulses to re-orient or disturb the molecules. As the molecules return (e.g., relax) to the gradient-induced orientation, the electrical emanations caused by the change are sensed with the coils.

Any number of orientations may be measured. For example, six or more. Wherever time permits, a greater number of orientations are measured, such as forty or more. Tens or hundreds of orientations may be measured.

Each raw diffusion MRI data measured along a gradient direction is a three-dimensional volume. Each volume represents the patient being scanned at a highest spatial resolution (e.g., 2 mm$^3$) the MRI system allows or spatial resolution used by the MRI system to acquire the data.

The diffusion tensors are estimated from the MR signal attenuations measured at a three-dimensional lattice along multiple gradient directions. A diffusion tensor is the covariance matrix of a three-dimensional normal distribution that is assumed to model the direction and the amount of diffusion at a spatial location. Different models may be used to represent the diffusion phenomenon, such as an orientation distribution function (ODF) or a fiber orientation distribution (FOD). In the case of a diffusion tensor, the principal direction of diffusion (PDD) is found by performing an eigenvalue decomposition: the eigenvector corresponding to the largest eigenvalue is the PDD.

The diffusion tensors generated from the measured MRI data are at the scan resolution. Lesser resolution may be provided. In alternative embodiments, the MRI data is interpolated to provide a greater resolution for the diffusion tensors prior to interpolating the diffusion tensors themselves.

Figure 2:
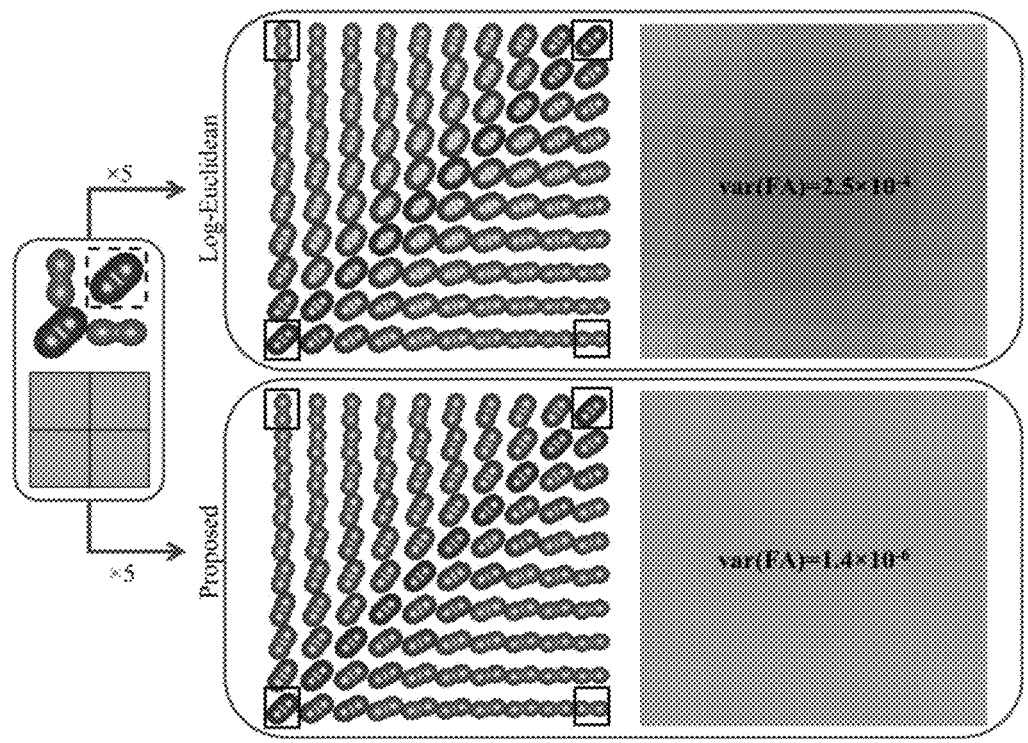
FIG. 2 illustrates interpolation of synthetically generated diffusion tensors using a closed form solution for shape.

In act 14, the diffusion tensors are interpolated. Additional diffusion tensors are created in between the previously generated diffusion tensors. For example, FIG. 2 shows four diffusion tensors on the left with the same shape but different orientations. For a ×5 interpolation, tensors are created in between these four tensors as represented in the middle column of FIG. 2. The diffusion tensors generated from the measured MR data in the middle column are surrounded by squares and the other diffusion tensors are generated via the proposed interpolation method.

A diffusion tensor processor of the magnetic resonance imaging system interpolates the diffusion tensors. The same processor that calculated the tensors from the measured MRI data or a different processor performs the interpolation. The diffusion tensor processor is a component of the MRI system, but may be part of a separate computer, server, or workstation in other embodiments. In one embodiment, the diffusion tensor processor has multiple cores or is a multi-thread processor for rapid computation in parallel to interpolate many diffusion tensors.

The diffusion tensors represent water diffusion in tissues, such as the human brain white matter. The MRI system produces DWIs that are used to generate the tensors. Water diffusion at a higher resolution is estimated via tensor interpolation. Any increase in resolution may be provided, such as at least doubling the resolution (e.g., from 2 mm$^3$ to 1 mm$^3$). In the example of FIG. 2, the resolution is increased by a factor of five. By interpolating the diffusion tensors, tensors representing water diffusion in the brain white matter or other tissue at locations between the tensors obtained from the DWIs are created. A diffusion map is interpolated using the tensors that are generated from the diffusion MRI measurements.

In one embodiment, the interpolation of the diffusion tensors is performed via Riemannian weighted averaging in orientation and shape spaces in a disjoint manner. Other approaches for interpolating tensors may be used, such as averaging solely on the Riemannian manifold of symmetric positive definite matrices of size 3×3.

In one embodiment, the orientation and shape components of the diffusion tensors are used in a disjoint manner for interpolation. An orientation space and a shape space are defined for interpolation. Diffusion tensor imaging (DTI) uses a 3×3 symmetric positive definite matrix $D \in Sym_3^+$ to model diffusion at a voxel. The diffusion tensors with the same principal direction also lie in $Sym_3^+$, called herein the shape space. The Log-Euclidean metric, $d_{LE}$, which is a similarity-invariant metric with computational advantages, is used in the interpolation of the shape components, but other distances may be used. The rotation group $SO(3) = \{\mathbb{R}^{3 \times 3} | R^T = R^{-1}, \det(R) = 1\}$ is the orientation space, where R denotes the orientation or rotation. Other representations of the two components may be used.

Table 1 shows example geodesic distances between the elements $R_i, R_j \in SO(3)$, the elements $D_i, D_j \in Sym_3^+$, and the group action act(•) of SO(3) on $Sym_3^+$ (i.e., the rotation of diffusion tensors).

TABLE 1

Information about the orientation and shape spaces

| Space | $Sym_3^+$ | SO(3) |
| --- | --- | --- |
| Distance | $d_{LE}(D_i, D_j) =$ $\|\log(D_j) - \log(D_i)\|_p$ | $d_{SO(3)}(R_i, R_j) =$ $2^{-1/2}\|\log(R_i^T R_j)\|_p$ |
| Action | $\forall R \in SO(3), \forall D \in Sym_3^+ \rightarrow$ $act(R)(D) = RDR^T$ | |

These distances as well as the group action define a new distance between two diffusion tensors as $d^2(D_i,D_j) = \min_{R \in SO(3)} d_{LE}^2(D_i, act(R)(D_j)) + \lambda d_{SO(3)}^2(I,R)$ with $\lambda > 0$ and identity matrix I. Here, the first term measures the dissimilarity in shape when $D_i$ and $D_j$ are aligned, and the second term measures the amount of alignment R that is needed. Other distance functions may be used. Different orientation estimation techniques and representations may be used.

To interpolate the diffusion tensors, the orientation and shape components of the tensors are interpolated in the respective Riemannian manifolds in a disjoint manner. A sum or other function of the orientation and shape components is minimized, maximized, or otherwise solved. In one embodiment, a sum with weights, the orientation components of the diffusion tensors derived from the MR data, and the shape components of these known diffusion tensors with a common orientation is minimized. The sum of a distance between the shapes of the tensors and a distance between the orientations of the tensors is minimized, along with non-negative weights, via Riemannian weighted averaging. Other functions may be used.

In one embodiment, the Riemannian weighted average of N tensors $\{D_n\}_{n=1}^N$ with weights $\{w_n\}_{n=1}^N$ is the solution to $\operatorname{argmin}_D \sum_{n=1}^N w_n d^2(D,D_n)$. This solution is computed via an iterative method. The iteration alternates between aligning the diffusion tensors to the current estimate and updating its orientation component with respect to shape given the current alignments and its shape component with respect to orientation. Let $D_n = act(R_n)(S_n) = R_n S_n R_n^T$ be the decomposition of D into an orientation component $R_n \in SO(3)$ and shape component $S_n \in Sym_3^+$. By defining the alignment variables as $Q_n = R_n R^T$, the problem to solve is as follows:

$$\min_{R,S,\{Q_n\}} \sum_{n=1}^N w_n(d_{LE}^2(S, Q_n D_n Q_n^T) + \lambda d_{SO(3)}^2(R^T, Q_n)) \rightarrow$$

$$\begin{cases} \text{Given } S = S^k \text{ and } R = R^k, \text{ solve } Q_n^{k+1} = \operatorname{argmin}_{Q_n} d_{LE}^2(S^k, Q_n D_n Q_n^T) + \lambda d_{SO(3)}^2((R^k)^T, Q_n) \\ \text{Given } S = S^k \text{ and } Q_n = Q_n^{k+1}, \text{ solve } R^{k+1} = \operatorname{argmin}_R \sum_{n=1}^N w_n d_{SO(3)}^2(R^T, Q_n^{k+1}) \\ \text{Given } R = R^{k+1} \text{ and } Q_n = Q_n^{k+1}, \text{ compute } S^{k+1} = \exp\left(\sum_{n=1}^N w_n \log(Q_n^{k+1} D_n (Q_n^{k+1})^T)\right) \end{cases}$$

The k+1-th estimate of the mean tensor is computed as $D^{k+1} = act(R^{k+1})(S^{k+1})$ and this iterative algorithm converges to a local minimum. In the case of interpolation, the problem is of the form $D(x) = \operatorname{argmin}_D \sum_{n=1}^N w_n(x) d^2(D,D(x_n))$, where the weights $w_n(x) \sim 1/\|x-x_n\|_2$ and N is the number of diffusion tensors around the location of interest $x \in \mathbb{R}^3$. Other functions may be used.

Iterative computing of a solution is used in act 16. Any method solving the argmin function may be used, such as the Nelder-Mead simplex method. Each iteration includes discrete steps. The computation of the solution alternates between aligning the created or interpolated diffusion tensors with a current estimate and updating the orientation and shape of the current estimate.

Due to the use of the Log-Euclidean metric in the shape space, the shapes of the interpolants (i.e., newly constructed diffusion tensors) are computed in closed form in act 18. Rather than relying on iterative minimization, the shapes are calculated or computed in a tractable way such that finite number of operations is needed. By defining the shape space with tensors with the same orientation, a closed form solution for the shapes of the new diffusion tensors results. In the embodiment above, the use of $d_{LE}$ results in computing the mean shape $S^{k+1}$ of the diffusion tensors in closed form. In the example above, the shape of the diffusion tensor being interpolated, $S^{k+1}$, is calculated with an exponential or other known function rather than a minimization function. The term "compute" is used in the equations above instead of "solve" to reflect this difference. In this example, the shape is computed as a matrix exponential of a sum of weighted matrix logarithms of the known diffusion tensors and the corresponding alignment variables (and their transposes).

FIG. 2 shows an example evaluation of interpolation on synthetic data in two dimensions, but three-dimensional data may be used. The synthetic data is generated as known tensors by projecting onto and rotating a tensor D=diag(0.4, 0.4, 2) in the xy-plane. Other tensors may be used. FIG. 2 shows the generated diffusion tensors as four bubble pairs and their fractional anisotropy (FA) values in grayscale. Note that the FA values of these four different diffusion tensors are the same. Two-dimensional interpolation of the four diffusion tensors is performed. The four diffusion tensors are placed at the corners of a grid and other diffusion tensors are interpolated in between. The interpolation is performed using the equations discussed above and using a Log-Euclidean metric for comparison. The shapes of the interpolated diffusion tensors using the closed form solution show little or no bloating or expansion in size. Conversely, the shapes of the interpolated diffusion tensors using the Log-Euclidean approach bloat or expand in size, particularly along the diagonal from the origin.

Figure 3:
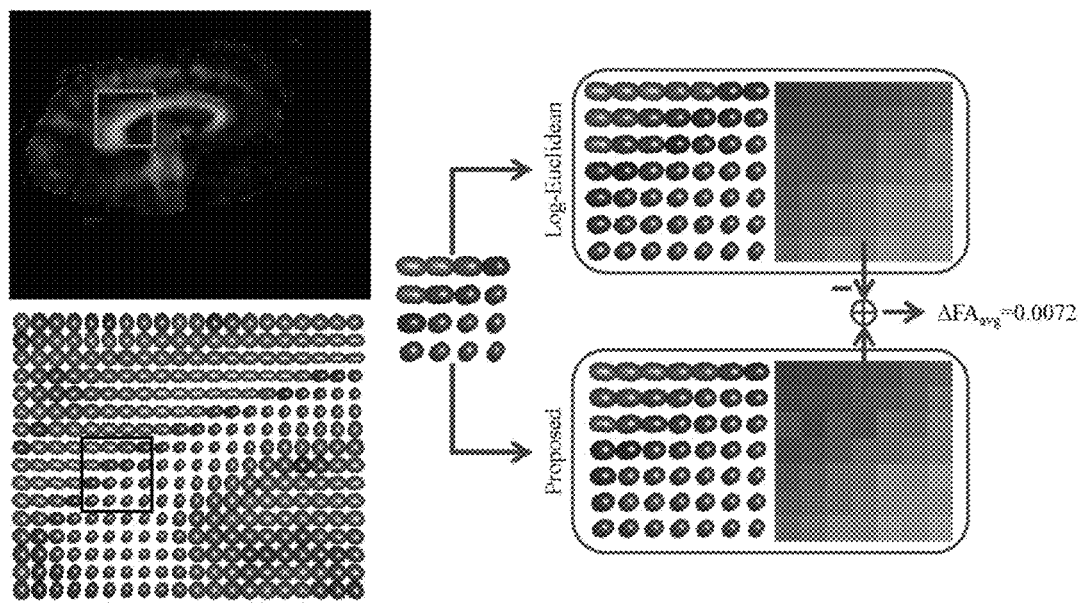
FIG. 3 illustrates interpolation from a patient scan of diffusion tensors using a closed form solution for shape.

FIG. 3 shows diffusion tensors from a scan of a patient. A human brain of a patient is scanned. Diffusion spectrum imaging of the healthy patient was performed with an 87×108×85 image matrix (with isotropic resolution of 2 mm$^3$) and along 256 gradient directions with 1 $B_0$ image. The upper left is a two-dimensional image of a cross-section of the brain. Following diffusion tensor fitting via least-squares, the image was selected as a sagittal slice. The lower left shows example diffusion tensors for the region of interest (square) of the brain cross-section. A further region of interest was selected in the diffusion tensors. This region of tensors is blown up or shown magnified in the center of FIG. 3. The selected region of interest is at the boundary between the corpus callosum (running left to right) and the cingulum (running anteroposterior). The resolution of the diffusion tensors is to be doubled. FIG. 3 shows using the approach with the equations above and, for comparison, using the Log-Euclidean metric to interpolate the diffusion tensor images by 2. Along the boundary between the corpus callosum and cingulum, there is less bloating using the approach described (e.g., closed form shape calculation using separate shape and orientation spaces) herein than using Log-Euclidean.

FIG. 3 shows a sample. The interpolation may be performed only for the region of interest, for other regions, and/or for the entire field of view. Similarly, the interpolation is performed for a two-dimensional slice or plane or is performed in three dimensions.

Referring again to FIG. 1, the magnetic resonance imaging system calculates biomarkers in act 22 from the interpolated diffusion tensors. The biomarkers are calculated from the scan-acquired diffusion tensors as well as the interpolated diffusion tensors. To increase the resolution of the biomarkers, the diffusion tensors created by fitting the diffusion tensor model to measured MR data and the diffusion tensors interpolated in between are used for calculating the biomarkers.

By using interpolated diffusion tensors as well as the scan-acquired diffusion tensors, the resulting biomarkers may be provided at a greater resolution than using just the scan-acquired diffusion tensors. The biomarkers are at a resolution greater than the resolution of the MR scan and/or the scan-acquired diffusion tensors. The resulting biomarker image has values for locations for which data was not obtained directly by the MRI scan. The scalar map of biomarker values is generated with greater resolution than the MRI scan.

Any biomarker may be calculated from the diffusion tensors. For example, a fractional anisotropy is calculated. The fractional anisotropy as a function of space provides a scalar map indicating the amount of water diffusion in tissues under study. Other characteristics of the diffusion tensors may be determined, such as diffusivity.

Prior to and/or after calculation of the biomarkers, further image processing may be applied. For example, averaging, filtering, convolution, decimation, or other processes are applied to the diffusion tensors and/or biomarker image. Any denoising or atlas generating process may be used. In another example, a pyramidal image analysis is performed.

In act 26, an image is generated. The image represents an interior region of the patient. The image represents the distribution of the biomarker values in one, two, or three dimensions. In one embodiment, the image is a two-dimensional image or a three-dimensional rendering to a two-dimensional display from biomarker voxel data representing three-dimensions. The scalar biomarker map provides a distribution, from which the image is generated (e.g., rendered).

The image is of the calculated biomarker. Diffusion MRI is provided. Fractional anisotropy, mean diffusivity, or other diffusion imaging may be used to visualize pathologies. In alternative or additional embodiments, diffusion weighted images are also displayed. The biomarker information may be combined with other information, such as a structural magnetic resonance image of the tissue.

The image is displayed on a display of an MRI system. Alternatively, the image is displayed on a workstation, computer or other device. The image may be stored in and recalled from a PACS memory.

Due to the interpolation, the image has an increased spatial resolution as compared to just using the scan-acquired diffusion MR images. Images of diffusion maps beyond the scan resolution may provide for better visualization of the structural brain connectivity and any impairment, if present, due to neurological diseases. The increased resolution in the image of the biomarker may be used for computer assisted diagnosis and/or surgery planning.

Referring again to FIG. 2, the variance due to tensor bloating in fractional anisotropy is decreased by using the proposed approach as compared to the Log-Euclidean approach. Since there is no shape difference between the four synthetically created tensors, a very small variance is expected in the fractional anisotropy (FA). The images on the right correspond to the resulting fractional anisotropy maps. Due to less tensor bloating, a smaller variance in FA results (i.e., $2.5 \times 10^{-4}$ for Log-Euclidean versus $1.4 \times 10^{-6}$ for the proposed approach). To further test variance, the diffusion tensor shown in the dashed square is rotated 18 times around the z-axis with an angular step of 5°, keeping the remaining three diffusion tensors intact. The interpolation is repeated for the diffusion tensor at each rotation. The cumulative variance in FA is computed. The proposed method achieves a smaller variance, i.e., $7.8 \times 10^{-6}$ compared to $5.4 \times 10^{-4}$ for the Log-Euclidean method.

Referring to FIG. 3, the proposed approach produces diffusion tensors with larger FA values on average along the tissue boundary between different white matter structures. The average difference in FA is 0.0072. This demonstrates the ability to reduce tensor bloating. More importantly, the higher-resolution diffusion tensor and FA images contain better delineated boundaries (i.e., with less number of tensors representing partial volume averaging and hence artificially reduced FAs) between different white matter structures. This improvement in the higher-resolution FA images may be useful in accurately quantifying neurodegeneration for population studies using voxel-based morphometry. The improvement may be useful in diagnosis or planning for an individual patient.

FIG. 4 shows a magnetic resonance (MR) system. The system includes an MR scanner 48, a memory 52, a processor 50, and a display 54. Additional, different, or fewer components may be provided. For example, a network or network connection is provided, such as for networking with a medical imaging network or data archival system. In another example, a user interface is provided.

The processor 50, memory 52, and display 54 are part of a medical imaging system, such as the MR scanner 48. Alternatively, the processor 50, memory 52, and/or display 54 are part of an archival and/or image processing system, such as associated with a medical records database workstation or server. In other embodiments, the processor 50, memory 52, and/or display 54 are a personal computer, such as desktop or laptop, a workstation, a server, a network, or combinations thereof. The processor 50, display 54, and memory 52 may be provided without other components for implementing tensor generation and interpolation.

The MR scanner 48 includes one or more radio frequency coils 58. For example, a plurality of coils 58 is provided, such as an array of local coils. Alternatively, one body coil is used. The MR scanner 48 includes a main field magnet 60, such as a cryomagnet, and gradient coils 56. The main field magnet 60 generates a relatively uniform $B_0$ magnetic field. The gradient coils 56 generate magnetic fields of desired or configured orientations. The gradient coils 56 are configured to sequentially orient molecules at different directions. For example, water or other fluid molecules are caused to be oriented in space at a specific direction. The radio frequency coil or coils 58 disturb the orientation of the molecules. A radio frequency pulse or pulses are transmitted from the coil or coils 58 into the patient. The pulse shifts the orientation (i.e., reorients) of at least some of the molecules. As the molecules relax or return to the orientation established by the gradient coils 56, the radio frequency coils 58, whether the same ones or different ones than used for transmit, receive electrical signals (i.e., K-space data). These electrical signals represent return of the molecules to the gradient orientation. The detected return may be used to determine the diffusion anisotropy. The detection is repeated for the different orientations.

The K-space data is reconstructed into object space by the MR scanner 48. For example, an inverse Fourier analysis is performed to determine raw MR data representing different locations in the object. Multiple sets of such raw MR data are acquired where each set corresponding to the gradient fields at a different orientation. For a given location in the scan region, different sets associated with different orientations are provided.

Other processing components may be provided, such as for planning and generating transmit pulses for the coils 58 based on the sequence and for receiving and processing the received k-space data. In one embodiment, the MR scanner 48 is a 1.5 T clinical MR scanner, such as a MAGNETOM Aera, from Siemens AG, Erlangen, Germany. MR scanners from other manufactures and/or with other main field strengths may be used.

The processor 50 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for interpolating diffusion tensors for MRI. The processor 50 is a single device or multiple devices operating in serial, parallel, or separately. The processor 50 may be a main processor of a computer, such as a laptop or desktop computer, or may be a processor for handling some tasks in a larger system, such as in the MRI scanner 48. The processor 50 is configured by instructions, design, hardware, and/or software to be able to perform the acts discussed herein, such as interpolating diffusion tensors.

The processor 50 is configured to form a diffusion map from the detected returns. For each location, a diffusion tensor model is fit to the diffusion MR data acquired along a set of orientations. The diffusion tensor mathematically represents the amount of anisotropy and the directional preference of diffusion for that location. The diffusion tensors are provided at the spatial resolution of the MR data, providing a diffusion map at the scan resolution.

The processor 50 is configured to interpolate the diffusion map to a higher resolution. The diffusion tensors are used as input for interpolation. An iterative solution for a cost minimization using distances in shape space and orientation space are used for interpolation. To speed computation by the processor 50, the shapes for each iteration are calculated as a closed from solution. The calculation may or may not be repeated each iteration while solving for the interpolated diffusion tensors. In one embodiment, the closed form solution is computed from the shapes being grouped by orientation. For example, the shape is a function of Riemannian weights, an alignment variable that is a function of an orientation component and a transpose of the orientation component, and the scan detected diffusion tensors. Other variables may be used.

The memory 52 is a graphics processing memory, a video random access memory, a random access memory, system memory, random access memory, cache memory, hard drive, optical media, magnetic media, flash drive, buffer, database, combinations thereof, or other now known or later developed memory device for storing data or image information. The memory 52 is part of the MR scanner 48, part of a computer associated with the processor 50, part of a database, part of another system, a picture archival memory, or a standalone device.

The memory 52 stores data representing a region of a patient. The data is MR data, such as k-space or object space raw MR data. The region is a two or three-dimensional region. The region is of any part of the patient, such as a region within the chest, abdomen, leg, head, arm, or combinations thereof. For diffusion imaging, the memory 52 stores diffusion tensors for the different locations in the region. The raw MR data or other processed MR data is used to calculate the diffusion tensors. Similarly, the memory 52 stores interpolated diffusion tensors for in-between the scan locations. Computed shapes may also be stored. The values of various variables during iterative processing are stored. Calculated biomarkers and/or an image may be stored.

The memory 52 or other memory is alternatively or additionally a computer readable storage medium storing data representing instructions executable by the programmed processor 50 for resolution enhancement of diffusion imaging. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The display 54 is a monitor, LCD, projector, plasma display, CRT, printer, or other now known or later developed devise for outputting visual information. The display 54 receives images, graphics, or other information from the processor 50, memory 52, or MR scanner 48. One or more diffusion images are displayed, such as biomarker images. The images are generated within 1-5 seconds from the scanning, allowing viewing and diagnosis at the time of imaging the patient or while the patient is still in a position for further MRI. Alternatively, the image is generated after a longer period from the scanning.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

I claim:

1. In a non-transitory computer readable storage medium, having stored therein data representing instructions executable by a programmed processor for resolution enhancement of diffusion imaging, the storage medium comprising instructions for:

solving for second diffusion tensors representing diffusion of water in the brain at locations between first diffusion tensors previously computed by a magnetic resonance system, where solving comprises averaging the first diffusion tensors in a shape space and in an orientation space;

determining a biomarker image from the first diffusion tensors and second diffusion tensors, the biomarker image having values for the locations not obtained by the magnetic resonance imager; and displaying the biomarker image on a display.

2. The non-transitory computer readable storage medium of claim 1 wherein solving comprises creating a higher-resolution image of the first and second tensors by interpolating the first diffusion tensors, and wherein determining comprises determining fractional anisotropy as a biomarker for the biomarker image.

3. The non-transitory computer readable storage medium of claim 1 wherein solving comprises minimizing a sum, with non-negative weights, of distances between the first diffusion tensors in the orientation space, and of distances between the first diffusion tensors that are aligned to have a common orientation in the shape space.

4. The non-transitory computer readable storage medium of claim 3 wherein minimizing comprises calculating a closed form solution for shapes of the second diffusion tensors as part of the minimization.

* * * * *